(12) United States Patent
Wang et al.

(10) Patent No.: US 11,299,063 B2
(45) Date of Patent: Apr. 12, 2022

(54) METHOD AND APPARATUS FOR CONTROLLING ELECTRIC POWER FLOW IN A BATTERY SYSTEM

(71) Applicant: GM GLOBAL TECHNOLOGY OPERATIONS LLC, Detroit, MI (US)

(72) Inventors: Yue-Yun Wang, Troy, MI (US); Andres V. Mituta, Lake Orion, MI (US); Garrett M. Seeman, Novi, MI (US); Justin Bunnell, Northville, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 102 days.

(21) Appl. No.: 16/788,850

(22) Filed: Feb. 12, 2020

(65) Prior Publication Data

US 2021/0245622 A1    Aug. 12, 2021

(51) Int. Cl.
*B60L 58/14* (2019.01)
*B60L 58/21* (2019.01)
(Continued)

(52) U.S. Cl.
CPC .............. *B60L 58/14* (2019.02); *B60L 58/21* (2019.02); *G01R 31/382* (2019.01);
(Continued)

(58) Field of Classification Search
CPC .... B60L 58/14; B60L 58/16; B60L 2240/549; B60L 50/64; B60L 58/18; B60L 58/21; H02J 7/0014; H02J 7/0021; H02J 7/0031; H02J 7/0048; H02J 7/00047; H02J 7/00304; H02J 7/00309; H02J 7/007; H02J 2310/48; H01M 10/425; H01M 10/48; H01M 10/482; H01M 10/4207; H01M 10/441;
(Continued)

(56) References Cited

U.S. PATENT DOCUMENTS 7,772,799 B2 *   8/2010   Wu ...................... H01M 10/482
                                                              320/104
8,710,800 B2 *   4/2014   Gibbs ...................... B60L 50/16
                                                              320/116
(Continued)

FOREIGN PATENT DOCUMENTS

JP         6147668 B2 *    6/2017  ............ H02J 7/0069
JP      2019053829 A  *    4/2019  ................ H02J 7/14
WO   WO-2012157332 A1 *   11/2012  ........ H01M 10/6557

*Primary Examiner* — Helen Rossoshek
(74) *Attorney, Agent, or Firm* — Quinn IP Law (57) ABSTRACT

A battery system is electrically connected to a power bus that is arranged to supply electric power to an on-vehicle actuator such as an electric traction machine. Controlling electric power flow in the battery pack includes determining states of charge for the plurality of battery packs, identifying one of the battery packs as a weakest battery pack based upon the states of charge, and determining an internal circulating current being transferred via the wiring harness that is associated with charging of the weakest battery pack. Electric power transfer through the wiring harness and the power bus is controlled such that the internal circulating current is less than an internal circulating current limit. In one embodiment, the internal circulating current limit is determined in relation to battery temperature.

16 Claims, 4 Drawing Sheets

(51) Int. Cl.
*H02J 7/00* (2006.01)
*G01R 31/382* (2019.01)

(52) U.S. Cl.
CPC ........ *H02J 7/0031* (2013.01); *H02J 7/00304* (2020.01); *H02J 7/00309* (2020.01); *H02J 2310/48* (2020.01)

(58) Field of Classification Search
CPC ............. H01M 10/443; H01M 10/625; H01M 10/633; H01M 2220/20; G01R 31/382; G01R 31/389; G01R 31/392; Y02E 60/10
See application file for complete search history.

(56) References Cited

U.S. PATENT DOCUMENTS

| | | | |
|---|---|---|---|
| 9,182,449 B2* | 11/2015 | Gibbs | B60L 58/12 |
| 9,213,068 B2* | 12/2015 | Baughman | G01R 31/3835 |
| 9,267,996 B2* | 2/2016 | Baughman | G01R 31/3835 |
| 9,466,862 B2* | 10/2016 | Aoki | H01M 10/425 |
| 9,641,011 B2* | 5/2017 | Ohkawa | H02J 7/0088 |
| 9,827,872 B1* | 11/2017 | Sloan | B60L 50/15 |
| 9,868,360 B2* | 1/2018 | Smidebrant | B60L 50/51 |
| 9,937,815 B2* | 4/2018 | Smidebrant | B60L 58/22 |
| 10,180,460 B1* | 1/2019 | Castelaz | G01R 31/3842 |
| 2017/0203654 A1* | 7/2017 | He | H01M 10/0525 |
| 2018/0001744 A1* | 1/2018 | Vehr | B60H 1/00428 |
| 2018/0309171 A1* | 10/2018 | Qin | H01M 10/4207 |
| 2019/0041467 A1* | 2/2019 | Takatsuka | H02J 7/0047 |
| 2019/0356012 A1* | 11/2019 | Hermann | B60L 58/18 |
| 2019/0359061 A1* | 11/2019 | Dan | H02J 7/0029 |
| 2020/0223422 A1* | 7/2020 | Ye | H02J 7/0019 |
| 2020/0406766 A1* | 12/2020 | Liu | H02J 7/00711 |
| 2021/0111446 A1* | 4/2021 | Stewart | H01M 10/443 |
| 2021/0237578 A1* | 8/2021 | Ing | B60L 3/0046 |

* cited by examiner

METHOD AND APPARATUS FOR CONTROLLING ELECTRIC POWER FLOW IN A BATTERY SYSTEM

INTRODUCTION

Vehicles and other systems employ DC power supplies in the form of rechargeable battery packs to supply electric power for vehicle propulsion and to provide other functions. A battery system may include multiple battery packs that are arranged in parallel and/or in series.

There may be an imbalance between states of charge of the battery packs employed in a battery system, wherein one of the battery packs has a higher state of charge than another of the battery packs. Imbalances between states of charge of the battery packs employed in a battery system may be difficult to avoid due to current flow characteristics associated with battery voltage potentials, charging schemes, especially so-called fast-charging schemes, differential aging of battery packs, temperature-induced differences in battery packs, and errors in estimating states of charge.

A difference in the states of charge may lead to an internal circulating current, wherein one battery pack of a battery system having a greater state of charge transfers electric energy to another of the battery packs that has a lesser state of charge. Occurrence of an uncontrolled internal circulating current charges the weakest battery pack having the lesser state of charge under some conditions, including, e.g., at very low battery temperature conditions, which may cause lithium plating and other effects in the battery. Furthermore, under cold weather conditions, high discharge loads can drive different amounts of polarization between the battery packs in a battery system, which can cause an uncontrolled circulating current once the load is removed and may cause lithium plating and other effects in the battery. Lithium plating in a battery may serve to increase internal battery impedance and reduce battery charge capacity, thus affecting service life of the battery pack.

As such, there is a need to manage and control internal circulating current between batteries in a battery system employing multiple battery packs, including in a manner that reduces or eliminates a likelihood of occurrence of lithium plating and other effects.

SUMMARY

The concepts described herein provide a method and associated system for controlling electric power flow in a battery pack that includes a plurality of electrically connected lithium-ion battery packs, wherein the battery system is electrically connected to a power bus to supply electric power to one or multiple electric machines and/or electrical actuators. In one embodiment, and as described herein, the battery system is employed on-vehicle, and includes a plurality of lithium-ion battery packs that are electrically connected via a wiring harness. instruction set executable The battery pack is electrically connected to a power bus that is arranged to supply electric power to an on-vehicle actuator such as an electric traction machine. Overall, controlling the electric power flow in the battery system includes determining states of charge for the plurality of battery packs, identifying one of the battery packs as a weakest battery pack based upon the states of charge and its impedance, and determining an internal circulating current being transferred via the wiring harness that is associated with charging of the weakest battery pack. Electric power transfer through the wiring harness and the power bus is controlled such that the internal circulating current that charges a weakest battery pack is less than an internal circulating current limit. In one embodiment, the internal circulating current limit is determined in relation to battery temperature.

An aspect of the disclosure includes controlling the electric power transfer through the wiring harness and the power bus such that the internal circulating current is less than the internal circulating current limit for the weakest pack, including identifying one of the battery packs as a weakest pack based upon the states of charge, and the pack impedances, determining the internal circulating current being transferred to the weakest battery pack via the wiring harness, and disconnecting the weakest battery pack from the wiring harness when the internal circulating current is greater than the internal circulating current limit.

Another aspect of the disclosure includes determining that the vehicle is in a key-off state, and disconnecting the weakest battery pack from the wiring harness when the internal circulating current is greater than the internal circulating current limit and the vehicle is in the key-off state.

Another aspect of the disclosure includes controlling electric power transfer through the wiring harness and the power bus such that the internal circulating current at vehicle light load or at vehicle stop is less than the internal circulating charge current limit, which includes executing feed-forward control based upon the battery states for the plurality of battery packs to determine a first load current for the given internal circulating current limit, executing feedback control based upon the weakest pack current measurement of internal circulating current and the corresponding current limit to determine a current feedback term, determining a bias load current based upon the first load current and the current feedback term, and controlling operation of an electrically-powered accessory device to control the internal circulating current based upon the bias load current.

Another aspect of the disclosure includes an electric machine being electrically connected to the power bus, and further includes monitoring electric load demand under vehicle high load states, identifying one of the battery packs as a strongest battery pack based upon the states of charge and the impedances of the battery packs, and, decreasing the electric load demand being delivered to the electric machine to control the electric power transfer through the wiring harness such that the discharge current of the strongest pack is less than a discharge current limit.

Another aspect of the disclosure includes introducing the bias load current onto the power bus to control the internal circulating current to be less than the internal circulating current limit.

Another aspect of the disclosure includes introducing the bias load current onto the power bus by introducing a resistive load onto the power bus to control the internal circulating current to be less than the internal circulating current limit.

Another aspect of the disclosure includes controlling operation of an electrically-powered accessory device to control the internal circulating current to be less than the internal circulating current limit.

Another aspect of the disclosure includes an electric power system for a vehicle that includes a battery system including plurality of battery packs, a plurality of sensors arranged to monitor the battery packs, a high-voltage DC power bus, a plurality of switches interposed between the plurality of battery packs and the power bus, an electric machine, and a controller. The battery packs are electrically connected via the wiring harness, and are electrically connected via the wiring harness to the power bus. The controller is in communication with the plurality of sensors, the plurality of switches, and the electric machine, and includes an instruction set that is executable to monitor, via the plurality of sensors, parameters associated with the plurality of battery packs, determine states of charge for the plurality of battery packs, determine an internal circulating current that is being transferred between the plurality of battery packs via the wiring harness based upon the states of charge, and control electric power transfer through the wiring harness and the power bus such that the internal circulating current is less than an internal circulating current limit.

The above summary is not intended to represent every possible embodiment or every aspect of the present disclosure. Rather, the foregoing summary is intended to exemplify some of the novel aspects and features disclosed herein. The above features and advantages, and other features and advantages of the present disclosure, will be readily apparent from the following detailed description of representative embodiments and modes for carrying out the present disclosure when taken in connection with the accompanying drawings and the claims.

BRIEF DESCRIPTION OF THE DRAWINGS

One or more embodiments will now be described, by way of example, with reference to the accompanying drawings, in which.

The appended drawings are not necessarily to scale, and may present a somewhat simplified representation of various preferred features of the present disclosure as disclosed herein, including, for example, specific dimensions, orientations, locations, and shapes. Details associated with such features will be determined in part by the particular intended application and use environment.

DETAILED DESCRIPTION

The components of the disclosed embodiments, as described and illustrated herein, may be arranged and designed in a variety of different configurations. Thus, the following detailed description is not intended to limit the scope of the disclosure, as claimed, but is merely representative of possible embodiments thereof. In addition, while numerous specific details are set forth in the following description in order to provide a thorough understanding of the embodiments disclosed herein, some embodiments can be practiced without some of these details. Moreover, for the purpose of clarity, certain technical material that is understood in the related art has not been described in detail in order to avoid unnecessarily obscuring the disclosure. Furthermore, the drawings are in simplified form and are not to precise scale. For purposes of convenience and clarity only, directional terms such as top, bottom, left, right, up, over, above, below, beneath, rear, and front, may be used with respect to the drawings. These and similar directional terms are not to be construed to limit the scope of the disclosure. Furthermore, the disclosure, as illustrated and described herein, may be practiced in the absence of an element that is not specifically disclosed herein.

As used herein, the term "system" may refer to one or a combination of mechanical and electrical hardware, sensors, controllers, application-specific integrated circuits (ASIC), combinatorial logic circuits, software, firmware, and/or other components that are arranged to provide the described functionality.

Figure 1:
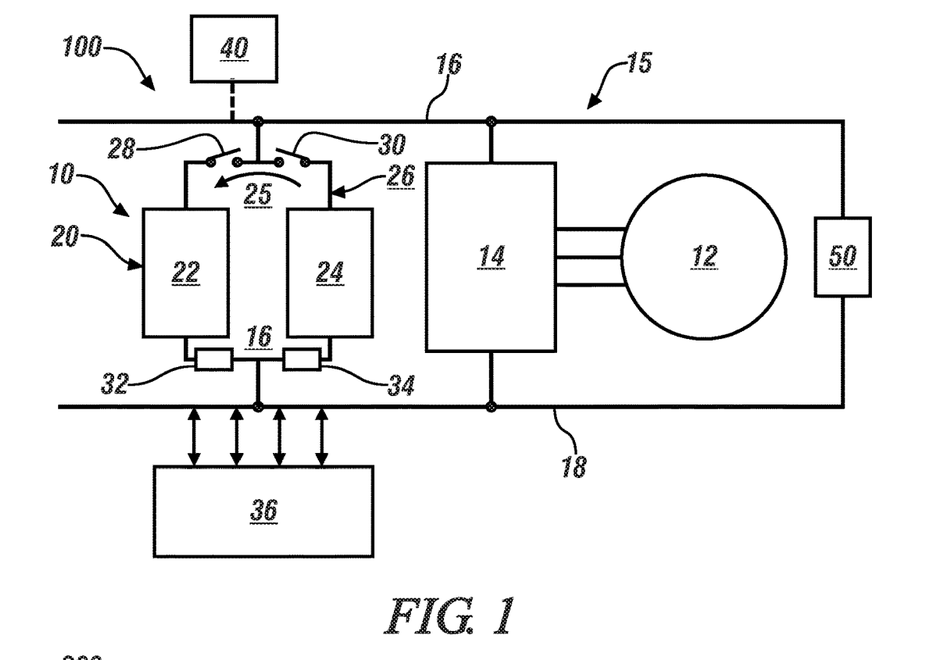
FIG. 1 schematically illustrates an electric power system that is arranged to supply electric power for operating an electric machine of a vehicle, in accordance with the disclosure.

Referring to the drawings, wherein like reference numerals correspond to like or similar components throughout the several Figures, FIG. 1, consistent with embodiments disclosed herein, illustrates an electric power system 10 that is arranged to supply electric power for operating an electric machine 12 of a vehicle 100. In one embodiment, the electric machine 12 is a multi-phase traction motor that generates and transfers tractive torque to a vehicle driveline in response to an operator torque request. The vehicle 100 may include, but not be limited to a mobile platform in the form of a commercial vehicle, industrial vehicle, agricultural vehicle, passenger vehicle, aircraft, watercraft, train, all-terrain vehicle, personal movement apparatus, robot and the like to accomplish the purposes of this disclosure. Alternatively, the electric power system 10 may be arranged to supply electric power for operating an electric machine of a stationary system.

The electric power system 10 includes a battery system 20 that electrically connects via a high-voltage (HV) DC power bus 15 and a power inverter 14 to the electric machine 12. The battery system 20 also electrically connects via the HV DC power bus 15 to a controllable electric load 50. A controller 36 monitors and/or controls operation of various elements of the electric power system 10. A charger 40 electrically connects to the battery system 20 via the HV DC power bus 15, which includes a positive HV bus 16 and a negative HV bus 18. The battery system 20 includes a plurality of lithium-ion battery packs, including first and second battery packs 22, 24, respectively, as shown. As employed herein, the battery system 20 is a unitary device that includes a plurality of battery packs, and is configured to deliver a desired voltage, current, and/or power density to the electric power system 10. As employed herein, the term "battery pack" describes a subset of the battery system, and includes a plurality of identical battery cells that are arranged in series, in parallel or in another combination to deliver a desired voltage, current, and/or power density to the battery system 20. The first and second battery packs 22, 24, respectively as shown are electrically connected via a wiring harness 26, which electrically connects to the positive HV bus 16. An internal circulating current 25 is defined as a magnitude of current that flows between the first and second battery packs 22, 24 via the wiring harness 26. The wiring harness 26 includes first and second switches 28, 30, respectively, which are controllable by the controller 36. The first switch 28 is arranged to electrically connect or disconnect the first battery pack 22 to the positive HV bus 16, and the second switch 30 is arranged to electrically connect or disconnect the second battery pack 24 to the positive HV bus 16. The first battery pack 22 electrically connects to the negative HV bus 18 via a first sensor pack 32, and the second battery pack 24 electrically connects to the negative HV bus 18 via a second sensor pack 34. The first and second sensor packs 32, 34 include sensing elements that monitor first and second voltage, current and temperature (VIT) parameters 33, 35, respectively, of the first and second battery packs 22, 24, respectively. The first and second sensor packs 32, 34 communicate the first and second VIT parameters 33, 35 to the controller 36. The controllable electric load 50 may include, by way of non-limiting examples, electrically-powered on-vehicle actuators such as a battery heater, an HVAC compressor, a cabin heater, a cabin fan, a coolant pump, an electric seat heater, a DC-DC charger, etc.

As described with reference to FIG. 2, et seq., the controller 36 monitors and/or controls operation of various elements of the electric power system 10, including monitoring inputs from the first and second sensor packs 32, 34, controlling activation of the first and second switches 28, 30, controlling operation of the controllable electric load 50, and controlling operation of the power inverter 14 to control the electric machine 12. Overall, monitoring and controlling operation of various elements of the electric power system 10 includes determining states of charge and associated temperatures for the plurality of battery packs, e.g., the first and second battery packs 22, 24, respectively, identifying one of the battery packs as a weakest battery based upon the states of charge and impedances, and determining the internal circulating current 25 that occurs in the wiring harness 26 and is associated with the weakest battery at vehicle light load or no load. The controller 36 controls electric power transfer between the first and second battery packs 22, 24, and controls electric power transfer between the battery system 20 and the HV DC power bus 15 such that the internal circulating current 25 is less than an internal circulating current limit in order to preclude deposition and plating of lithium onto battery electrodes of the battery packs.

Figure 2:
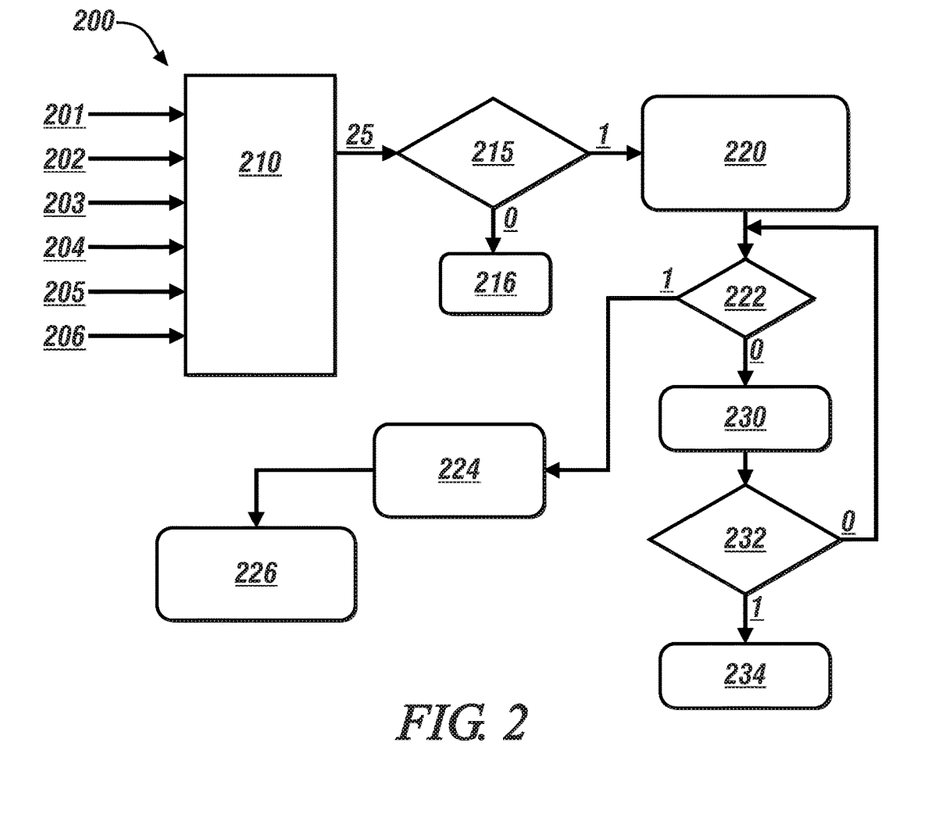
FIG. 2 schematically illustrates a control routine associated with an operation to preclude deposition and plating of lithium onto battery electrodes of first and second battery packs, in accordance with the disclosure.

FIG. 2, et seq. schematically illustrate control routines associated with methods for controlling operation of the operations of the electric power system 10 and the vehicle 100 to preclude deposition and plating of lithium onto battery electrodes of battery packs that may be caused by internal circulating current at low vehicle load or no vehicle load. The method is illustrated as a collection of blocks in a logical flow graph, which represents a sequence of operations that can be implemented in hardware, software, or a combination thereof. In the context of software, the blocks represent computer instructions that, when executed by one or more processors, perform the recited operations.

Referring now to FIG. 2, with continued reference to the elements of the electric power system 10 for the vehicle 100 that are described with reference to FIG. 1, a first control routine 200 is described, and is associated with operations to preclude deposition and plating of lithium onto battery electrodes of the first and second battery packs 22, 24, respectively, by controlling the internal circulating current 25, including under conditions that include a vehicle key-on/key-off state. Execution of the first control routine 200 includes determining and evaluating the internal circulating current 25 under vehicle operating conditions that include the vehicle 100 being in a key-off state. This includes determining various vehicle parameters by direct monitoring, modelling, simulation, or another method. The vehicle parameters include vehicle speed (201); states of charge of the first and second battery packs 22, 24 (202); battery temperatures T1 and T2 of the first and second battery packs 22, 24, respectively (203); the key-off state (204); internal circulating (charge) current limits $I_{L1}$, $I_{L2}$ of the first and second battery packs 22, 24, respectively (205); and battery states (206). The internal circulating current limits $I_{L1}$, $I_{L2}$ of the first and second battery packs 22, 24, respectively may be determined in relation to the battery temperatures T1 and T2 of the first and second battery packs 22, 24, respectively, and represent maximum allowable charging current levels to prevent lithium plating at the respective temperature. The aforementioned vehicle parameters are input to a routine 210 to estimate, measure or otherwise determine the internal circulating current 25 when the vehicle 100 is in a power-off state. The routine 210 determines the internal circulating current 25 in accordance with the following relationship:

$$L\frac{di1}{dt} + i_1 r_{s2} = V_{T2} - V_{T1} \qquad [1]$$

wherein:

$i_1$ represents the internal circulating current 25, and is associated with the weakest of the first and second battery packs 22, 24;

$V_{T1}$ represents the terminal voltage measured at the first battery pack 22;

$V_{T2}$ represents the terminal voltage measured at the second battery pack 24;

L represents inductance in the wiring harness 26; and $R_{s2}$ represents resistance in the wiring harness 26.

Alternatively, the internal circulating current 25 may be directly measured by the first and second sensor packs 32, 34. The internal circulating current 25 is compared with the internal circulating current limits $I_{L1}$, $I_{L2}$ of the first and second battery packs 22, 24, respectively, which are determined as maximum current levels to prevent lithium plating, in relation to temperature (215).

When the internal circulating current 25 is less than the internal circulating current limits $I_{L1}$, $I_{L2}$ of the first and second battery packs 22, 24, respectively (215)(0), no action is required (216), and this iteration ends.

When the internal circulating current 25 is greater than the internal circulating current limits $I_{L1}$, $I_{L2}$ of the first and second battery packs 22, 24, respectively (215)(1), the states of charge of the first and second battery packs 22, 24, respectively are evaluated to identify one of the first and second battery packs 22, 24, respectively as being the weakest battery pack, with the weakest battery pack being the one of the first and second battery packs 22, 24, respectively that has the lesser state of charge.

The one of the first and second switches 28, 30 that is associated with the identified weakest battery pack is opened to electrically disconnect the weakest battery pack from the other battery pack and thus interrupt the internal circulating current 25 (220).

The vehicle key-on/key-off status continues to be monitored (222). When the key-on/key-off status indicates that the vehicle 100 is in the key-on state (222)(1), a desired discharge load power to prevent lithium plating is estimated (224), and when an actual discharge load power is substantially greater than the desired discharge load power (226), the opened one of the first and second switches 28, 30 associated with the identified weakest battery pack is closed to electrically reconnect the weakest battery pack to the other battery pack and the HV DC power bus 15 (226).

When the key-on/key-off status indicates that the vehicle 100 remains in the key-off state (222)(0), an internal circulating current associated with an increased battery temperature is estimated (230), and evaluated by comparing the estimated internal circulating current with the internal circulating current limits $I_{L1}$, $I_{L2}$ of the first and second battery packs 22, 24, respectively (232). When the estimated internal circulating current is greater than the internal circulating current limits $I_{L1}$, $I_{L2}$ of the first and second battery packs 22, 24, respectively (232)(0), the vehicle key-on/key-off status is again monitored (222). However, when the estimated internal circulating current is less than the internal circulating current limits $I_{L1}$, $I_{L2}$ of the first and second battery packs 22, 24, respectively (232)(1), the opened one of the first and second switches 28, 30 associated with the identified weakest battery pack is closed to electrically reconnect the weakest battery pack to the other battery pack and the HV DC power bus 15 (234). In this manner, the first control routine 200 accommodates operation that includes a vehicle key-off state, including evaluating operation in relation to battery temperature.

Figure 3:
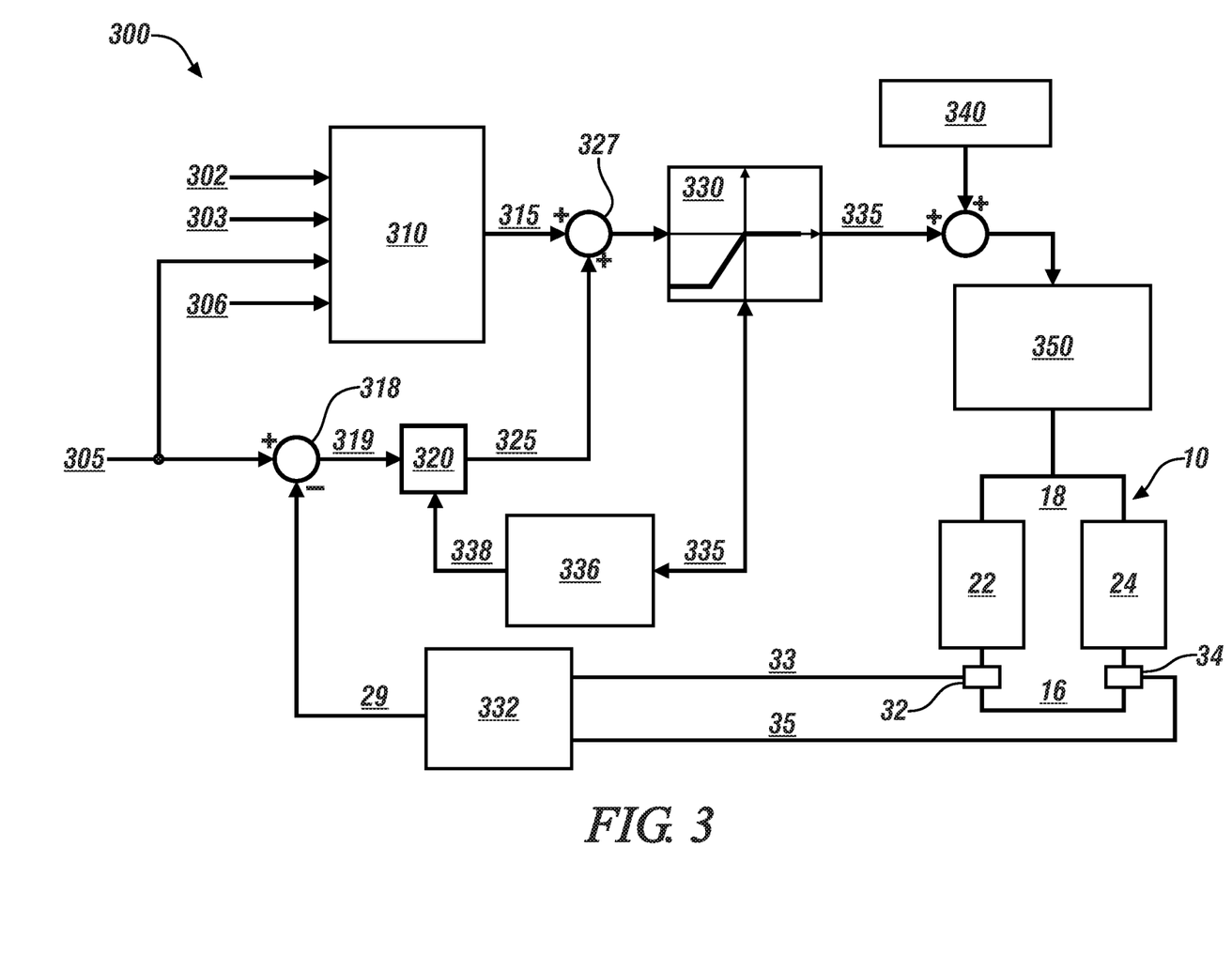
FIG. 3 schematically illustrates another control routine associated with an operation to preclude deposition and plating of lithium onto battery electrodes of first and second battery packs, in accordance with the disclosure.

Referring now to FIG. 3, with continued reference to the elements of the electric power system 10 for the vehicle 100 that are described with reference to FIG. 1, a second control routine 300 is described, and is associated with operations to preclude deposition and plating of lithium onto battery electrodes of the first and second battery packs 22, 24, respectively, by controlling the internal circulating current 25 under the charge current limit at vehicle light load or no load, including increasing power bus load by turning on additional accessory loads, such as electrical system heater, raising cabin or heated seat temperature. On the other hand, when the vehicle 100 is operating in a full load discharge state, the discharge current from the strongest of the battery packs 22 or 24 will be controlled to operate below its discharge current limit by operating the electric machine 12 to generate less tractive power. The second control routine 300 may be in the form of an executable instruction set that is implemented in the controller 36.

Execution of the second control routine 300 includes determining and evaluating the internal circulating current 25 under vehicle operating conditions that include the vehicle 100 being in a key-on or key-off state, by determining various vehicle parameters by direct monitoring, modelling, simulation, or another method. The vehicle parameters include states of charge of the first and second battery packs 22, 24, respectively (302); battery temperatures T1 and T2 of the first and second battery packs 22, 24, respectively (303); internal circulating current limits $I_{L1}$, $I_{L2}$ of the first and second battery packs 22, 24, respectively (305); and other battery states (306), such as polarization voltage of the first and second battery packs 22, 24. The polarization voltage is the battery internal voltage drop other than its open circuit voltage. The aforementioned vehicle parameters are input to a routine 310 to determine a first, feed-forward load current 315 for operating the vehicle 100.

The feed-forward load current 315 may be determined by employing a physics-based feed-forward estimator as follows in EQ. 2:

$$L\frac{d(i)}{dt} + R_{m2}i = I_{L1}(R_{m1}+R_{m2}) + \text{IR\_Free\_V}_1(I_{L1}) - \text{IR\_Free\_V}_2 \quad [2]$$

wherein i represents a total current load applied to the battery system 20;

L represents inductance in the wiring harness 26;

$R_{m1}$ represents internal resistance of the first battery pack 22;

$R_{m2}$ represents internal resistance of the second battery pack 24;

$I_{L1}$ represents an internal circulating current limit for the first battery pack 22 that is assumed to be the weakest battery;

IR_Free_$V_1$ represents the voltage of the first battery pack 22 minus the voltage drop $R_{m1} i_1$;

IR_Free_$V_2$ represents the voltage of the second battery pack 24 minus the voltage drop $R_{m2} i_2$; and $R_{s2}$ represents resistance in the wiring harness 26.

EQ. 2 may be simplified as follows:

$$i = \frac{1}{R_{m2}}[I_{L1}(R_{m1}+R_{m2}) + OCV_1 - OCV_2] \quad [3]$$

wherein:

i represents the total current load applied to the battery system 20;

L represents inductance in the wiring harness 26;

$R_{m1}$ represents internal resistance of the first battery pack 22;

$R_{m2}$ represents internal resistance of the second battery pack 24;

OCV1 represents open circuit voltage at the first battery pack 22;

OCV2 represents open circuit voltage at the second battery pack 24; and $I_{L1}$ represents an internal circulating current limit for the weakest battery, e.g., the first battery pack 22 in one embodiment.

Coincidently, the first and second voltage, current and temperature (VIT) parameters 33, 35, respectively, from the first and second battery packs 22, 24, respectively are evaluated in a feedback loop to select the current 29 (332) either from a weakest pack or from a strongest pack based on control needs, for example, when controlling internal circulating current under charge current limit under vehicle light load or no load conditions, the current of the weakest pack being charged is selected; likewise, at vehicle full load request or discharge state, the discharge current of the strongest pack is selected, which is provided as feedback to an adder function 318, and subtracted from the corresponding charge current limits $I_{L1}$, $I_{L2}$ of the first and second battery packs 22, 24, respectively to determine a current difference 319, which is provided as input to a proportional-integral (PI) controller 320. The PI controller 320 generates a current feedback term 325 based upon the current difference 319. The current feedback term 325 is combined with the feed-forward load current 315 by adder 327 to determine a bias load current 335, which is subjected to an anti-windup and saturation control term 330, which is graphically portrayed.

The bias load current 335 is provided as feedback to an integrator anti-windup function 336, which generates the anti-windup term 338 that is provided to the PI controller 320 to generate the current feedback term 325.

At vehicle light load or no load, to control the internal circulating current under charge current limit, the bias load current 335 is added to a present operating load current 340 to determine a final load current 350. The final load current 350 is employed by the controller 36 to control operation of the one or a plurality of the vehicle accessory loads to ensure that the internal circulating current 25 is less than the internal circulating current limits $I_{L1}$, $I_{L2}$ of the first and second battery packs 22, 24, respectively, to preclude deposition and plating of lithium onto battery electrodes of the first and second battery packs 22, 24 respectively. Similarly, at vehicle full load demand, the determined final load current 350 from the feedforward and feedback control will be achieved by derating motor torque or motor current that is delivered to the electric machine 12.

Figure 4:
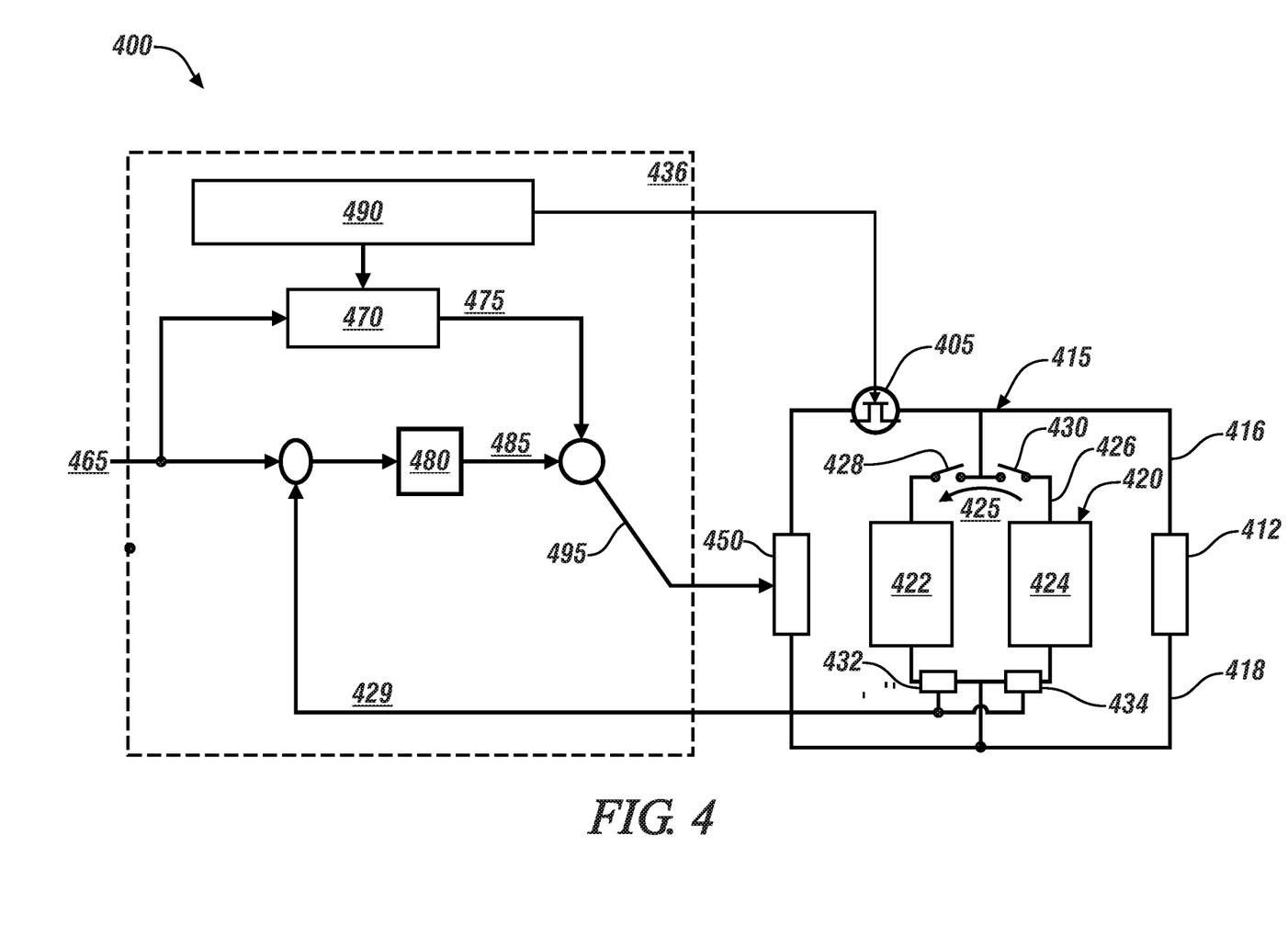
FIG. 4 schematically illustrates another control routine associated with an operation to preclude deposition and plating of lithium onto battery electrodes of first and second battery packs, in accordance with the disclosure.

Referring now to FIG. 4, another control routine 400 is described, and is associated with operations to preclude deposition and plating of lithium onto battery electrodes of first and second battery packs 422, 424, respectively, of an electrical power system 410 by controlling an internal circulating current 425. The control routine 400 is associated with and acts to control the electrical power system 410 that includes a controllable resistive load 450 that is arranged on a HV DC power bus 415. This includes controlling the controllable resistive load to introduce a bias load onto the HV DC power bus 415 to control the internal circulating current 425 to be less than an internal circulating current limit.

The electric power system 410 includes a battery pack 420 that electrically connects via the HV DC power bus 415 to a vehicle load 412, which may include a power inverter and electric machine. The battery pack 420 also electrically connects via the HV DC power bus 415 to a controllable resistive load 450. A controller 436 monitors and/or controls operation of various elements of the electric power system 410. The HV DC power bus 415 includes a positive HV bus 416 and a negative HV bus 418. The battery pack 420 includes a plurality of lithium-ion battery packs, including first and second battery packs 422, 424, respectively, as shown. The first and second battery packs 422, 424, respectively as shown are electrically connected via a wiring harness 426, which electrically connects to the positive HV bus 416. The internal circulating current 425 is defined as a magnitude of current that flows between the first and second battery packs 422, 424 via the wiring harness 426. The wiring harness 426 includes first and second switches 428, 430, respectively, which are controllable by the controller 436. The first switch 428 is arranged to electrically connect or disconnect the first battery pack 422 to the positive HV bus 416, and the second switch 430 is arranged to electrically connect or disconnect the second battery pack 424 to the positive HV bus 416. The first battery pack 422 electrically connects to the negative HV bus 418 via a first sensor pack 432, and the second battery pack 424 electrically connects to the negative HV bus 418 via a second sensor pack 434. The first and second sensor packs 432, 434 include sensing elements that monitor first and second voltage, current and temperature (VIT) parameters of the first and second battery packs 22, 24, respectively. The first and second sensor packs 432, 434 communicate the first and second VIT parameters to the controller 436. The controllable resistive load 450 is a variable resistive device that is arranged between the positive and negative HV buses 416, 418, and is connected thereto by a switch 405 that is controlled by the controller 436.

The control routine 400 may be implemented in the controller 436 in the form of an executable instruction set that is implemented therein, including when operating the electric machine 12 to generate tractive power at low load or no load. The control routine 400 includes evaluating first and second voltage, current and temperature (VIT) parameters from the first and second battery packs 422, 424, respectively, to determine a minimum current 429. The minimum current 429 and internal circulating current limits $I_{L1}$, $I_{L2}$ of the first and second battery packs 422, 424 (465) are input to a PI feedback control 480, which generates a resistance correction term 485 based upon a current difference therebetween. The internal circulating current limits $I_{L1}$, $I_{L2}$ of the first and second battery packs 422, 424, respectively, are determined in relation to the respective battery temperatures T1 and T2. The internal circulating current limits $I_{L1}$, $I_{L2}$ are also provided to a feed-forward routine 470 to determine a feed-forward internal circulating resistance 475. The feed-forward internal circulating resistance 475 and the resistance correction term 485 are combined to determine a bias load resistance 495, which is provided as input to control the controllable resistive load 450.

The feed-forward routine 470 determines the feed-forward internal circulating resistance 475 in accordance with the following relation:

$$R = \frac{V^2}{V*i - PwL} \quad [4]$$

wherein:

R represents the feed-forward internal circulating resistance 475;

V represents battery system terminal voltage;

i represents the desired load current, determined based upon EQS. 2 and 3; and

PwL represents vehicle load power.

The controller 436 controls the switch 405 to activate the controllable resistive load 450 between the positive and negative HV buses 416, 418 when a difference between the desired discharge power, V*i and the vehicle load power, PwL is greater than 0 (490). The magnitude of the bias load resistance 495 induced by the controllable resistive load 450 is determined based upon the combining of the feed-forward internal circulating resistance 475 and the resistance correction term 485.

Figure 5:
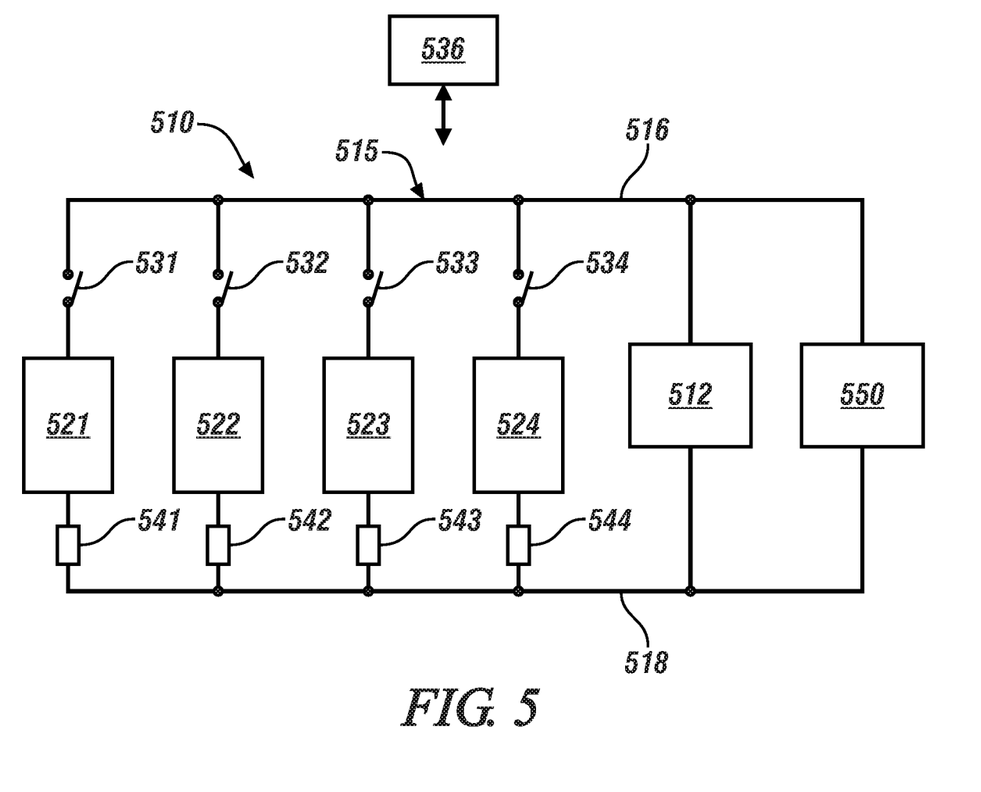
FIG. 5 schematically illustrates another control routine associated with an operation to preclude deposition and plating of lithium onto battery electrodes of multiple battery packs, in accordance with the disclosure.

FIG. 5 schematically shows an electric power system 510 that includes a battery system 520 that electrically connects via the HV DC power bus 515 to a vehicle load 512, which may include a power inverter and an electric machine, and to other vehicle accessory loads, indicated by numeral 550. The HV DC power bus 515 includes a positive HV bus 516 and a negative HV bus 518. The battery system 520 includes a plurality of lithium-ion battery packs, including, in one embodiment and as shown, first, second, third, and fourth battery packs 521, 522, 523, and 524, respectively. The first, second, third, and fourth battery packs 521, 522, 523, and 524 are electrically connected between the positive HV bus 516 via switches 531, 532, 533, and 534, respectively, and the negative HV bus 518. Currents i1, i2, i3, and i4 from the respective first, second, third, and fourth battery packs 521, 522, 523, and 524 are monitored by VIT sensors 541, 542, 543, and 544, respectively.

In operation, the controller 536 monitors information from the VIT sensors 541, 542, 543, and 544 to determine parameters for the respective first, second, third, and fourth battery packs 521, 522, 523, and 524, including, e.g., currents, cell voltages, and pack temperatures. The parameters for the respective first, second, third, and fourth battery packs 521, 522, 523, and 524 are employed to determine respective charge and discharge current limits $I_{L1}$, $I_{L2}$, $I_{L3}$, $I_{L4}$. When one or more of the currents i1, i2, i3, and i4 from the respective first, second, third, and fourth battery packs 521, 522, 523, and 524 is greater in magnitude than the respective current limits $I_{L1}$, $I_{L2}$, $I_{L3}$, $I_{L4}$, actions are undertaken to control the respective circulating charging current by deactivating the respective one of the switches 531, 532, 533, and 534 when there is no load or at light load, or by inducing a bias load to one of the vehicle accessories 550 to reduce the respective charging current.

When at full load driving demand, actions are undertaken to control the respective discharge current from the strongest pack within the discharge current limit by derating a motor torque or current or other electric power consumption in vehicles. This includes monitoring electric load demand being delivered to the electric machine, identifying one of the battery packs as a strongest battery pack based upon the states of charge and the impedances of the battery packs, and decreasing the electric load demand being delivered to the electric machine to control the electric power transfer through the wiring harness such that the discharge current of the strongest pack is less than a discharge current limit. This facilitates controlling electric power transfer through the wiring harness and the power bus such that in case a driver demands a full power in cold weather, the discharge current of the strongest battery pack in a battery system is less than the battery discharge current limit. This includes executing feed-forward control based upon the battery states for the plurality of battery packs to determine a first load current for the given discharge current limit, executing feedback control based on the actual strongest pack current measurement and the discharge current limit to determine a current feedback term, determining a bias load current based upon the first load current and the current feedback term, and controlling operation of one or more electric motors or actuators by deducting the bias load current from the electric motors, such that the current of the strongest pack will not exceed the discharge current limit.

The term "controller" and related terms such as microcontroller, control module, module, control, control unit, processor and similar terms refer to one or various combinations of Application Specific Integrated Circuit(s) (ASIC), Field-Programmable Gate Array (FPGA), electronic circuit(s), central processing unit(s), e.g., microprocessor(s) and associated non-transitory memory component(s) in the form of memory and storage devices (read only, programmable read only, random access, hard drive, etc.). The non-transitory memory component is capable of storing machine readable instructions in the form of one or more software or firmware programs or routines, combinational logic circuit(s), input/output circuit(s) and devices, signal conditioning, buffer circuitry and other components, which can accessed by and executed by one or more processors to provide a described functionality. Input/output circuit(s) and devices include analog/digital converters and related devices that monitor inputs from sensors, with such inputs monitored at a preset sampling frequency or in response to a triggering event. Software, firmware, programs, instructions, control routines, code, algorithms and similar terms mean controller-executable instruction sets including calibrations and look-up tables. Each controller executes control routine(s) to provide desired functions. Routines may be executed at regular intervals, for example each 100 microseconds during ongoing operation. Alternatively, routines may be executed in response to occurrence of a triggering event. Communication between controllers, actuators and/or sensors may be accomplished using a direct wired point-to-point link, a networked communication bus link, a wireless link or another suitable communication link. Communication includes exchanging data signals in suitable form, including, for example, electrical signals via a conductive medium, an electromagnetic signal via air, optical signals via optical waveguides, and the like. The data signals may include discrete, analog or digitized analog signals representing inputs from sensors, actuator commands, and communication between controllers.

The term "signal" refers to a physically discernible indicator that conveys information, and may be a suitable waveform (e.g., electrical, optical, magnetic, mechanical or electromagnetic), such as DC, AC, sinusoidal-wave, triangular-wave, square-wave, vibration, and the like, that is capable of traveling through a medium.

The term 'model' refers to a processor-based or processor-executable code and associated calibration that simulates a physical existence of a device or a physical process. As used herein, the terms 'dynamic' and 'dynamically' describe steps or processes that are executed in real-time and are characterized by monitoring or otherwise determining states of parameters and regularly or periodically updating the states of the parameters during execution of a routine or between iterations of execution of the routine.

The terms "calibration", "calibrated", and related terms refer to a result or a process that correlates a desired parameter and one or multiple perceived or observed parameters for a device or a system. A calibration as described herein may be reduced to a storable parametric table, a plurality of executable equations or another suitable form that may be employed as part of a measurement or control routine.

A parameter is defined as a measurable quantity that represents a physical property of a device or other element that is discernible using one or more sensors and/or a physical model. A parameter can have a discrete value, e.g., either "1" or "0", or can be infinitely variable in value.

The flowchart and block diagrams in the flow diagrams illustrate the architecture, functionality, and operation of possible implementations of systems, methods, and computer program products according to various embodiments of the present disclosure. In this regard, each block in the flowchart or block diagrams may represent a module, segment, or portion of code, which comprises one or more executable instructions for implementing the specified logical function(s). It will also be noted that each block of the block diagrams and/or flowchart illustrations, and combinations of blocks in the block diagrams and/or flowchart illustrations, may be implemented by dedicated-function hardware-based systems that perform the specified functions or acts, or combinations of dedicated-function hardware and computer instructions. These computer program instructions may also be stored in a computer-readable medium that can direct a computer or other programmable data processing apparatus to function in a particular manner, such that the instructions stored in the computer-readable medium produce an article of manufacture including instruction set that implements the function/act specified in the flowchart and/or block diagram block or blocks.

The detailed description and the drawings or figures are supportive and descriptive of the present teachings, but the scope of the present teachings is defined solely by the claims. While some of the best modes and other embodiments for carrying out the present teachings have been described in detail, various alternative designs and embodiments exist for practicing the present teachings defined in the claims.

What is claimed is:

1. A method for controlling electric power flow in a battery system for a vehicle, wherein the battery system includes a plurality of battery packs that are electrically connected via a wiring harness, and wherein the battery packs are electrically connected via the wiring harness to a power bus, the method comprising:
- monitoring, via a plurality of sensors, parameters associated with the plurality of battery packs;
- determining states of charge and impedances for the plurality of battery packs;
- determining an internal circulating current that is being transferred between the plurality of battery packs via the wiring harness based upon the states of charge; and
- controlling electric power transfer through the wiring harness by introducing a resistive load onto the power bus such that the internal circulating current is less than an internal circulating current limit.

2. The method of claim 1, wherein controlling the electric power transfer through the wiring harness such that the internal circulating current is less than the internal circulating current limit comprises:
- identifying one of the battery packs as a weakest battery pack based upon the states of charge and the impedances of the battery packs;
- determining the internal circulating current being transferred to the weakest battery pack via the wiring harness; and
- disconnecting the weakest battery pack from the wiring harness when the internal circulating current is greater than the internal circulating current limit.

3. The method of claim 2, further comprising determining that the vehicle is in a key-off state; and
- disconnecting the weakest battery pack from the wiring harness when the internal circulating current is greater than the internal circulating current limit and the vehicle is in the key-off state.

4. The method of claim 1, wherein controlling electric power transfer through the wiring harness such that the internal circulating current is less than the internal circulating current limit comprises:
- executing feed-forward control based upon the states of charge and the impedances for the plurality of battery packs to determine a first load current;
- executing feedback control based upon the internal circulating current and the internal circulating current limit to determine a current feedback term;
- determining a bias load current based upon the first load current and the current feedback term; and
- controlling operation of an electrically-powered accessory device to control the internal circulating current based upon the bias load current.

5. The method of claim 4, wherein controlling electric power transfer through the wiring harness such that the internal circulating current is less than the internal circulating current limit comprises introducing the resistive load as the bias load current onto the power bus to control the internal circulating current to be less than the internal circulating current limit.

6. The method of claim 1, further comprising an electric machine being electrically connected to the power bus; the method further comprising:
- monitoring electric load demand being delivered to the electric machine;
- identifying one of the battery packs as a strongest battery pack based upon the states of charge and the impedances of the battery packs; and
- decreasing the electric load demand being delivered to the electric machine to control the electric power transfer through the wiring harness such that the discharge current of the strongest pack is less than a discharge current limit.

7. A method for controlling electric power flow in a battery system for a vehicle, wherein the battery system includes a plurality of lithium-ion battery packs that are electrically connected via a wiring harness, and wherein the battery system is electrically connected via the wiring harness to a power bus, the method comprising:
- monitoring, via a plurality of sensors, parameters associated with the plurality of battery packs;
- determining states of charge and impedances for the plurality of lithium-ion battery packs;
- determining an internal circulating current being transferred via the wiring harness; and
- controlling electric power transfer through the wiring harness and the power bus by introducing a resistive load onto the power bus such that the internal circulating current is less than an internal circulating current limit.

8. The method of claim 7, wherein controlling electric power transfer through the wiring harness and the power bus such that the internal circulating current is less than an internal circulating current limit comprises:
- identifying one of the battery packs as a weakest battery pack based upon the states of charge;
- determining the internal circulating current being transferred to the weakest battery pack via the wiring harness; and
- disconnecting the weakest battery pack from the wiring harness when the internal circulating current is greater than the internal circulating current limit.

9. The method of claim 8, further comprising disconnecting the weakest battery pack from the wiring harness when the internal circulating current is greater than the internal circulating current limit and when the vehicle is in a key-off state.

10. The method of claim 7, wherein controlling electric power transfer through the wiring harness and the power bus such that the internal circulating current is less than the internal circulating current limit comprises:
- executing feed-forward control based upon the states of charge and the impedances for the lithium-ion battery packs to determine a first load current;
- executing feedback control based upon the internal circulating current and the internal circulating current limit to determine a current feedback term;
- determining a bias load current based upon the first load current and the current feedback term; and
- controlling operation of an electrically-powered accessory device to control the internal circulating current based upon the bias load current.

11. The method of claim 10, wherein controlling electric power transfer through the wiring harness such that the internal circulating current is less than the internal circulating current limit comprises introducing the resistive load as the bias load current onto the power bus to control the internal circulating current to be less than the internal circulating current limit.

12. An electric power system for a vehicle, comprising:
- a battery system including plurality of battery packs, a plurality of sensors arranged to monitor the battery packs, a high-voltage DC power bus, a plurality of switches interposed between the plurality of battery packs and the power bus, an electric machine, a wiring harness, and a controller;
- wherein the plurality of battery packs are electrically connected via the wiring harness;
- wherein the plurality of battery packs are electrically connected via the wiring harness to the power bus;

wherein the controller is in communication with the plurality of sensors, the plurality of switches, and the electric machine;

wherein the controller includes an instruction set, wherein the instruction set is executable to:

monitor, via the plurality of sensors, parameters associated with the plurality of battery packs, determine states of charge and impedances for the plurality of battery packs, determine an internal circulating current that is being transferred between the plurality of battery packs via the wiring harness based upon the states of charge and the impedances of the battery packs, and control electric power transfer through the wiring harness and the power bus by introducing a resistive load onto the power bus such that the internal circulating current is less than an internal circulating current limit.

13. The electric power system of claim 12, wherein the instruction set being executable to control electric power transfer through the wiring harness and the power bus such that the internal circulating current is less than the internal circulating current limit comprises the instruction set being executable to:

identify one of the battery packs as a weakest battery pack based upon the states of charge, determine the internal circulating current being transferred to the weakest battery pack via the wiring harness, and disconnect the weakest battery pack from the wiring harness when the internal circulating current is greater than the internal circulating current limit.

14. The electric power system of claim 13, further comprising the instruction set being executable to determine that the vehicle is in a key-off state; and disconnect the weakest battery pack from the wiring harness when the internal circulating current is greater than the internal circulating current limit and the vehicle is in the key-off state.

15. The electric power system of claim 12, wherein the instruction set being executable to control the electric power transfer through the wiring harness and the power bus such that the internal circulating current is less than the internal circulating current limit comprises the instruction set being executable to control operation of an electrically-powered accessory device to control the internal circulating current to be less than the internal circulating current limit.

16. The electric power system of claim 12, wherein the instruction set being executable to control electric power transfer through the wiring harness such that the internal circulating current is less than the internal circulating current limit comprises the instruction set being executable to:

execute a feed-forward control routine based upon the states of charge and the impedances for the plurality of battery packs to determine a first load current;

execute a feedback control routine based upon the internal circulating current and the internal circulating current limit to determine a current feedback term;

determine a bias load current based upon the first load current and the current feedback term; and control operation of an electrically-powered accessory device to control the internal circulating current based upon the bias load current.

* * * * *